US012687994B2

(12) United States Patent
Su

(10) Patent No.: US 12,687,994 B2
(45) Date of Patent: Jul. 21, 2026

(54) DISPLAY SYSTEM BASED ON CONTROLLABLE BROADCAST AUDIO

(71) Applicant: SHENZHEN GO-ON ELECTRONICS CO., LTD, Shenzhen (CN)

(72) Inventor: Xuefeng Su, Shenzhen (CN)

( * ) Notice: Subject to any disclaimer, the term of this patent is extended or adjusted under 35 U.S.C. 154(b) by 0 days.

(21) Appl. No.: 18/788,125

(22) Filed: Jul. 30, 2024

(65) Prior Publication Data

US 2025/0045005 A1     Feb. 6, 2025

(51) Int. Cl.

| | |
|---|---|
| *G09G 5/00* | (2006.01) |
| *G06F 3/02* | (2006.01) |
| *G06F 3/14* | (2006.01) |
| *G06F 3/16* | (2006.01) |
| *G09G 3/32* | (2016.01) |
| *H04R 3/04* | (2006.01) |
| *H04R 5/033* | (2006.01) |
| *H10W 90/00* | (2026.01) |

(52) U.S. Cl.
CPC ................. *G06F 3/14* (2013.01); *G06F 3/02* (2013.01); *G06F 3/162* (2013.01); *G09G 3/32* (2013.01); *H04R 3/04* (2013.01); *H04R 5/033* (2013.01); *G09G 2370/16* (2013.01); *H04R 2420/07* (2013.01); *H10W 90/00* (2026.01)

(58) Field of Classification Search
CPC .. G06F 3/14; G06F 3/02; G06F 3/162; G09G 3/32; G09G 2370/16; H04R 3/04; H04R 5/033; H04R 2420/07; H01L 25/167

USPC .......................................................... 345/168
See application file for complete search history.

(56) References Cited

U.S. PATENT DOCUMENTS

| | | | | |
|---|---|---|---|---|
| 2014/0098206 A1* | 4/2014 | Rosella | .................... | H04N 5/77 |
| | | | | 381/74 |
| 2018/0000179 A1* | 1/2018 | Simon | ....................... | A41G 7/02 |
| 2018/0063626 A1* | 3/2018 | Pong | ....................... | G06F 1/163 |
| 2021/0112301 A1* | 4/2021 | Carney Landow | .. | H04R 1/1041 |
| 2022/0405804 A1* | 12/2022 | Kuleshova | ................ | G06F 3/00 |
| 2023/0324701 A1* | 10/2023 | Kasar | ................ | G02B 27/0006 |
| | | | | 345/8 |

* cited by examiner

*Primary Examiner* — Jennifer T Nguyen

(57) ABSTRACT

A display system based on controllable broadcast audio is disclosed, including a wireless transmission device, a wireless receiver, a display unit, and a data connection cable. The wireless transmission device is communicated with the wireless receiver, and the wireless receiver is connected with the display unit via the data connection cable. The display system has a simple structure and can realize multi-purpose applications. The display system can simultaneously transmit audio, control signals and display signals by means of broadcasting to achieve a joint control for audio playback, channels and light of the wireless receiver. Thus, the display system is especially suitable for dance floors, meetings and other occasions combined multiple headsets, which can establish a cool lighting atmosphere and has a wider range of applications.

7 Claims, 8 Drawing Sheets

24MHz crystal    Microphone    Button

APP

BT ANT

BLE chip
YC1155

LED matrix

SPI

LED driver chip

UART

Wireless receiver headset

DISPLAY SYSTEM BASED ON CONTROLLABLE BROADCAST AUDIO

TECHNICAL FIELD

The present application relates to the technical field of communication technology improvement, and in particular to a display system based on controllable broadcast audio.

BACKGROUND

Headsets are used as signal conversion devices to receive electrical signals transmitting by media players or receivers and convert the electrical signals into sound waves to human ear via speaker. Some of the headsets also include earphone mic that capture audio, and then send the captured audio to the media players or the receivers for information interaction. However, the headsets can only receive audio, convert audio signals into sound for playback, and cannot modify audio signals effective pattern, text, pattern, etc., which makes consumers lack of visual experience, and cannot show rich and vivid visual effects.

SUMMARY

The present disclosure aims to provide a display system based on controllable broadcast audio to address above technical problems.

To achieve above objectives, the present disclosure adopts following technical solutions. In some embodiments of the present disclosure, a display system based on controllable broadcast audio is provided, including a wireless transmission device, a wireless receiver, a display unit, and a data connection cable. Herein the wireless transmission device is communicated with the wireless receiver, and the wireless receiver is connected with the display unit via the data connection cable.

In some preferred embodiments of the present disclosure, the display unit comprises a display frame, an LED matrix disposed on the display frame, and an LED driver chip disposed in the display frame. An output end of the LED driver chip is connected with a drive end of the LED matrix.

In some preferred embodiments of the present disclosure, the display unit is a mask with display function, a display panel, a display hood, a display badge, a display knapsack with a display, or a display arm bag with a display.

In some preferred embodiments of the present disclosure, the mask includes a mask body and a mask display screen, the mask display screen is disposed on an upper part of a front of the mask body, and the mask display screen is connected with the wireless receiver via a data cable. The display panel includes a panel display screen and a tightening belt, the panel display screen is provided with connectors on both sides of a back thereon, and two ends of the tightening belt are connected with the connectors. The display hood includes a hood body and a hood display screen, the hood display screen is disposed on a front of the hood body, the wireless receiver is disposed on a top or a back of the hood body, and the wireless receiver is connected with the hood display screen via a soft circuit. The display badge includes a badge display screen and a lanyard, the lanyard is attached with the badge display screen. The display knapsack includes a knapsack body and a knapsack display screen, the knapsack display screen is disposed on a face of the knapsack body. The display arm bag includes an arm bag body and an arm bag display screen, the arm bag display screen is provided on the arm bag body.

In some preferred embodiments of the present disclosure, the wireless receiver adopts a wireless headset with an output interface.

In some preferred embodiments of the present disclosure, the wireless transmission device includes a wireless transmitter and an input keyboard, the input keyboard is connected with an input end of the wireless transmitter, the wireless transmitter is provided with an audio input interface for audio source.

In some preferred embodiments of the present disclosure, the wireless transmitter includes an audio input module for audio source, an audio compression and amplification module, a stereo and light control modulation module, a high frequency amplification module, a microcontroller module, a high frequency locking-in module, a transmitting antenna, and a light control input interface module. Herein an output end of the audio input module for audio source is connected with an input end of the audio compression and amplification module, an output end of the audio compression and amplification module is connected with an input end of the stereo and light control modulation module, an output end of the stereo and light control modulation module is connected with and input end of the high frequency locking-in module, an output end of the high frequency locking-in module is connected with an input end of the transmitting antenna, the audio compression and amplification module is connected with the microcontroller module for two-way communication, an output end of the microcontroller module is connected with an input end of the high frequency locking-in module, an output end of the high frequency locking-in module is connected with an input end of the high frequency amplification module, and an input end of the microcontroller module is connected with an output end of the light control input interface module.

In some preferred embodiments of the present disclosure, the wireless headset includes a headset housing and a wireless reception and playback system disposed in the headset housing. The wireless reception and playback system includes a receiving antenna, a high-frequency amplification and frequency conversion unit, a medium-frequency adjustment unit, an audio extension amplification unit, a microcontroller unit, a light display unit, a PLL phase-locked unit, a local oscillator unit, a signal output interface unit, a speaker, and a battery voltage stabilized unit. Herein an output end of the receiving antenna is connected with an input end of the high-frequency amplification and frequency conversion unit, an output end of the high-frequency amplification and frequency conversion unit is connected with an input end of the medium-frequency adjustment unit, an output end of the medium-frequency adjustment unit is connected with an input end of the audio extension amplification unit, and an output end of the audio extension amplification unit is connected with an input end of the speaker. The microcontroller unit is connected with the medium-frequency adjustment unit for two-way communication, and an output end of the microcontroller unit is connected with an output end of the light display unit, an input end of the signal output interface unit and an input end of the PLL phase-locked unit respectively. An output end of the PLL phase-locked unit is connected with an input end of the local oscillator unit, an output end of the local oscillator unit is connected with an input end of the high-frequency amplification and frequency conversion unit. The battery voltage stabilized unit is electrically connected with the microcontroller unit.

In some preferred embodiments of the present disclosure, the output end of the signal output interface unit is a 3.5 audio interface.

In some preferred embodiments of the present disclosure, the display unit further includes a Bluetooth chip, the Bluetooth chip is communicated with the LED driver chip, the wireless headset is connected with the Bluetooth chip through the data connection cable, and the Bluetooth chip is also connected with a microphone, a switch button, and 24 MHz crystal respectively.

The display system based on controllable broadcast audio of the present disclosure has at least following beneficial effects. The display system has a simple structure, which can realize multi-purpose applications. Specifically, the display system can simultaneously transmit audio, control signals and display signals by means of broadcasting to achieve a joint control for audio playback, channels and light of the wireless receiver. Thus, the display system is especially suitable for dance floors, meetings and other occasions combined multiple headsets, which can establish a cool lighting atmosphere and has a wider range of applications. The side and top of the wireless headset can produce lights, it is safer when night walking, with luminous uniformity, and also can be used as a night light. Through channel control, it makes the device work on one or several channels set, which is more convenient to use. In addition, the display system also has a beautiful and generous appearance.

DETAILED DESCRIPTION OF THE EMBODIMENTS

Figure 1:
FIG. 1 shows a structure diagram of a display system based on controllable broadcast audio in accordance with some embodiments of the present disclosure.
Figure 2:
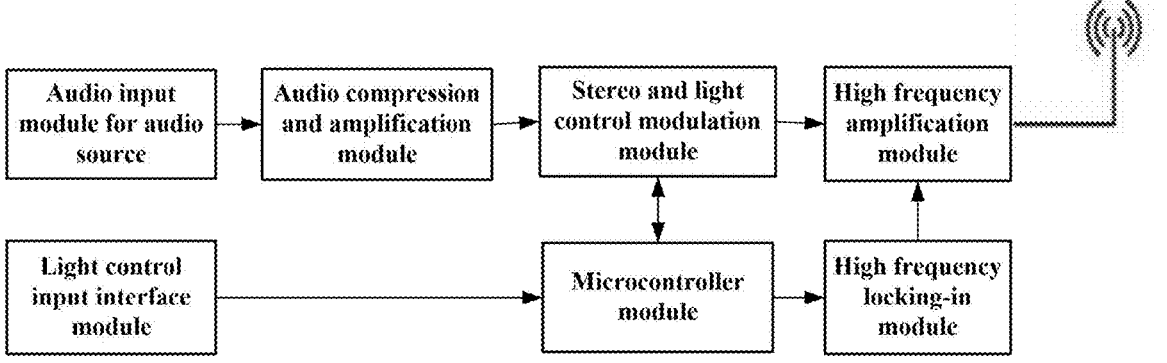
FIG. 2 shows a structure diagram of a wireless transmitter in accordance with some embodiments of the present disclosure.
Figure 3:
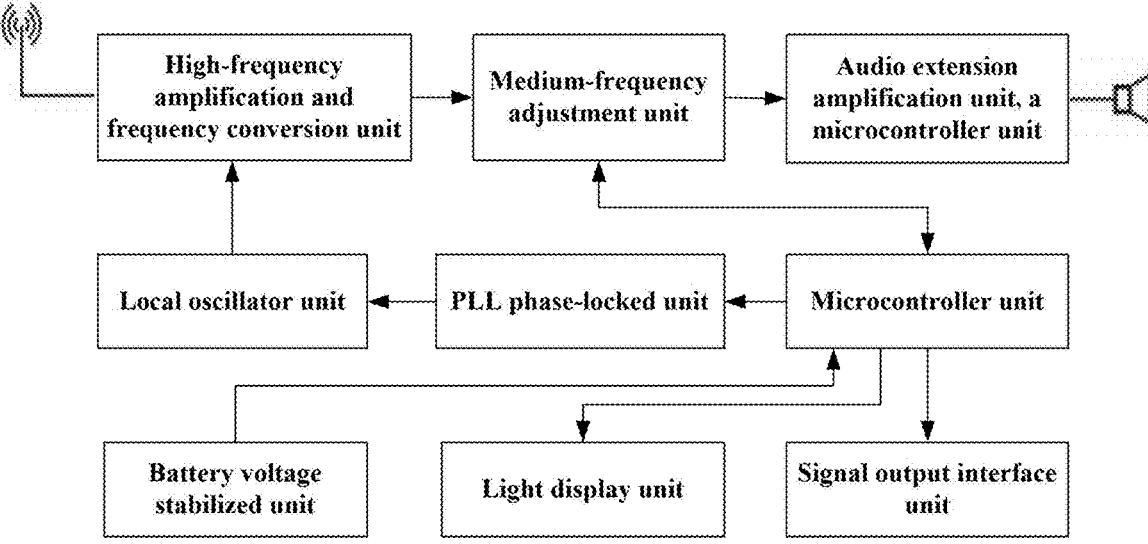
FIG. 3 shows a structure diagram of a wireless headset in accordance with some embodiments of the present disclosure.
Figures 4, 5:
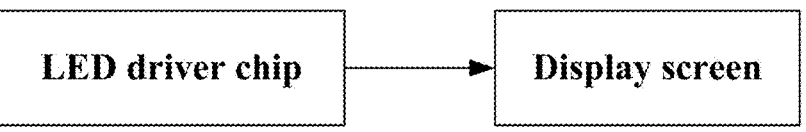
FIG. 4 shows a structure diagram of a display unit in accordance with some embodiments of the present disclosure.
FIG. 5 shows an electrical schematic diagram of the display unit in accordance with some embodiments of the present disclosure.
Figure 6:
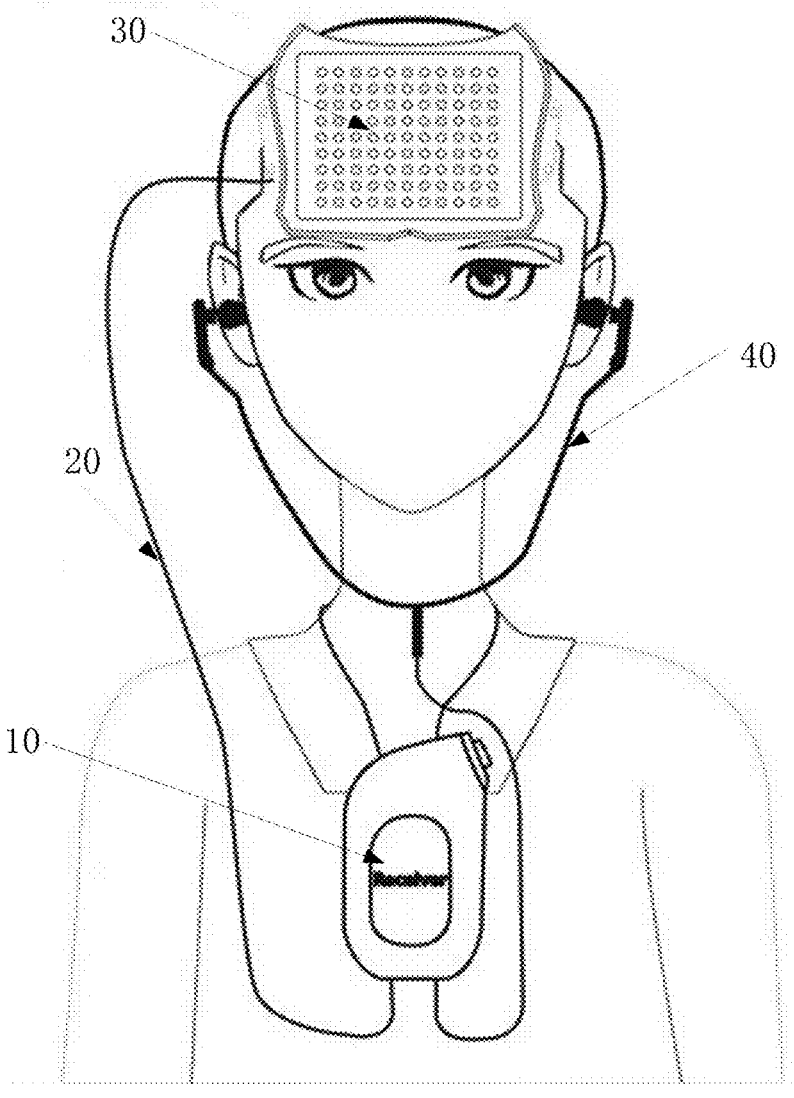
FIG. 6 shows a structure diagram of a display hood in accordance with some embodiments of the present disclosure.
Figure 7:
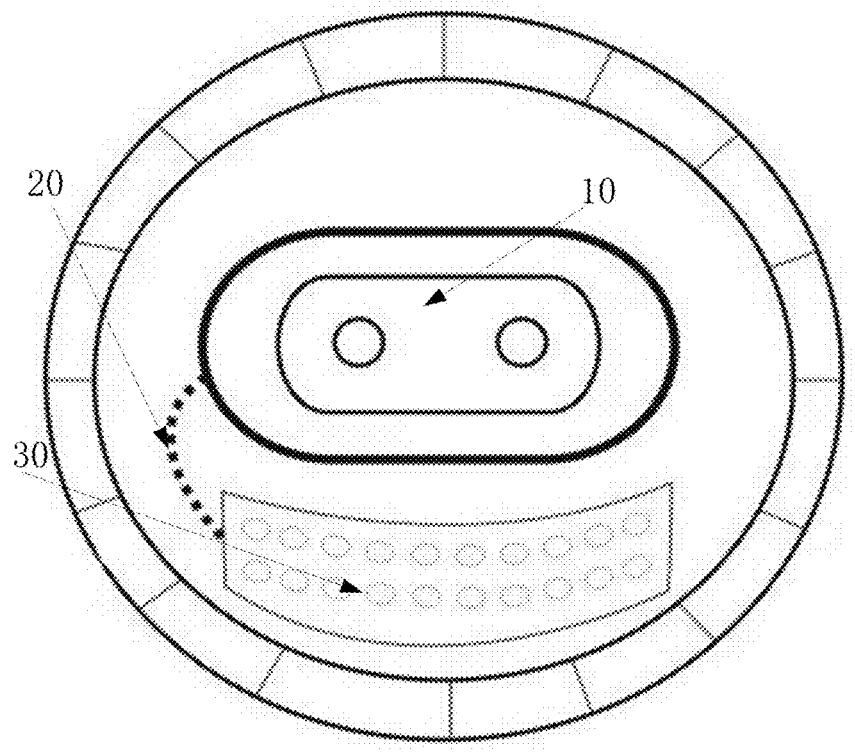
FIG. 7 shows another structure diagram of a display system based on controllable broadcast audio in accordance with some embodiments of the present disclosure.
Figure 8:
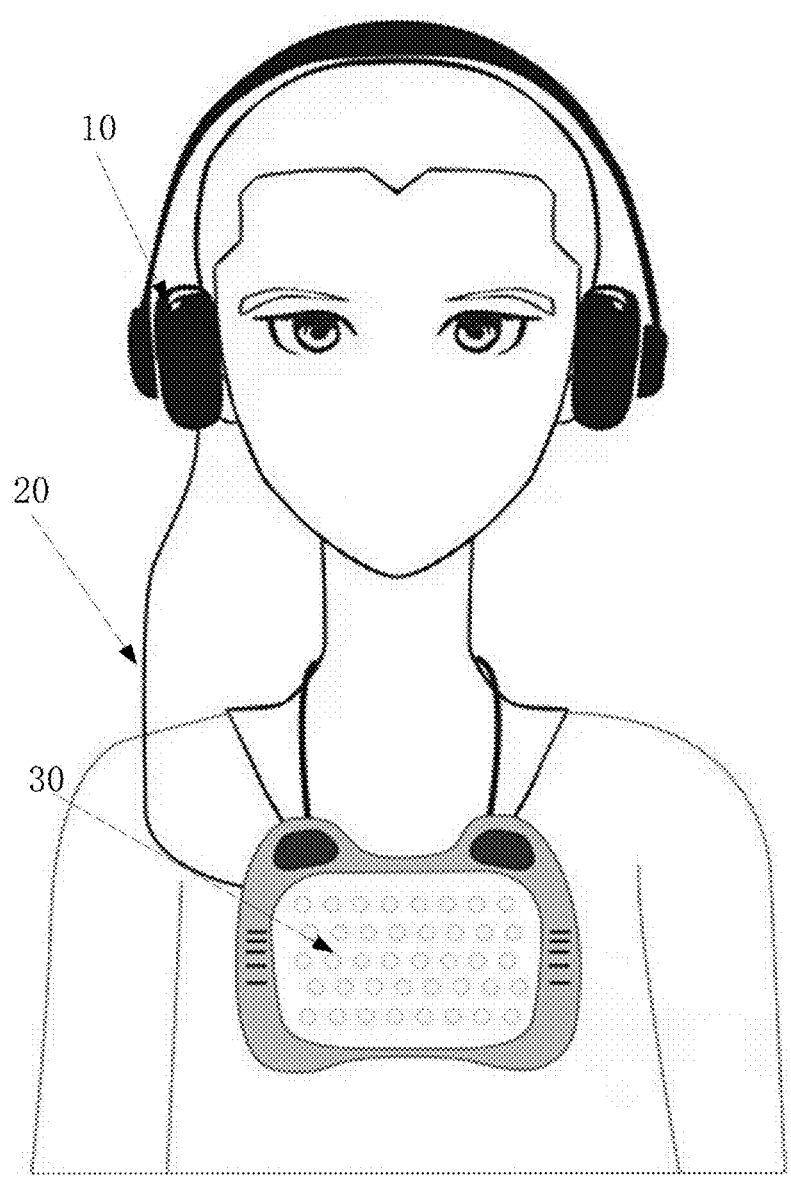
FIG. 8 shows a structure diagram of a display badge in accordance with some embodiments of the present disclosure.
Figure 9:
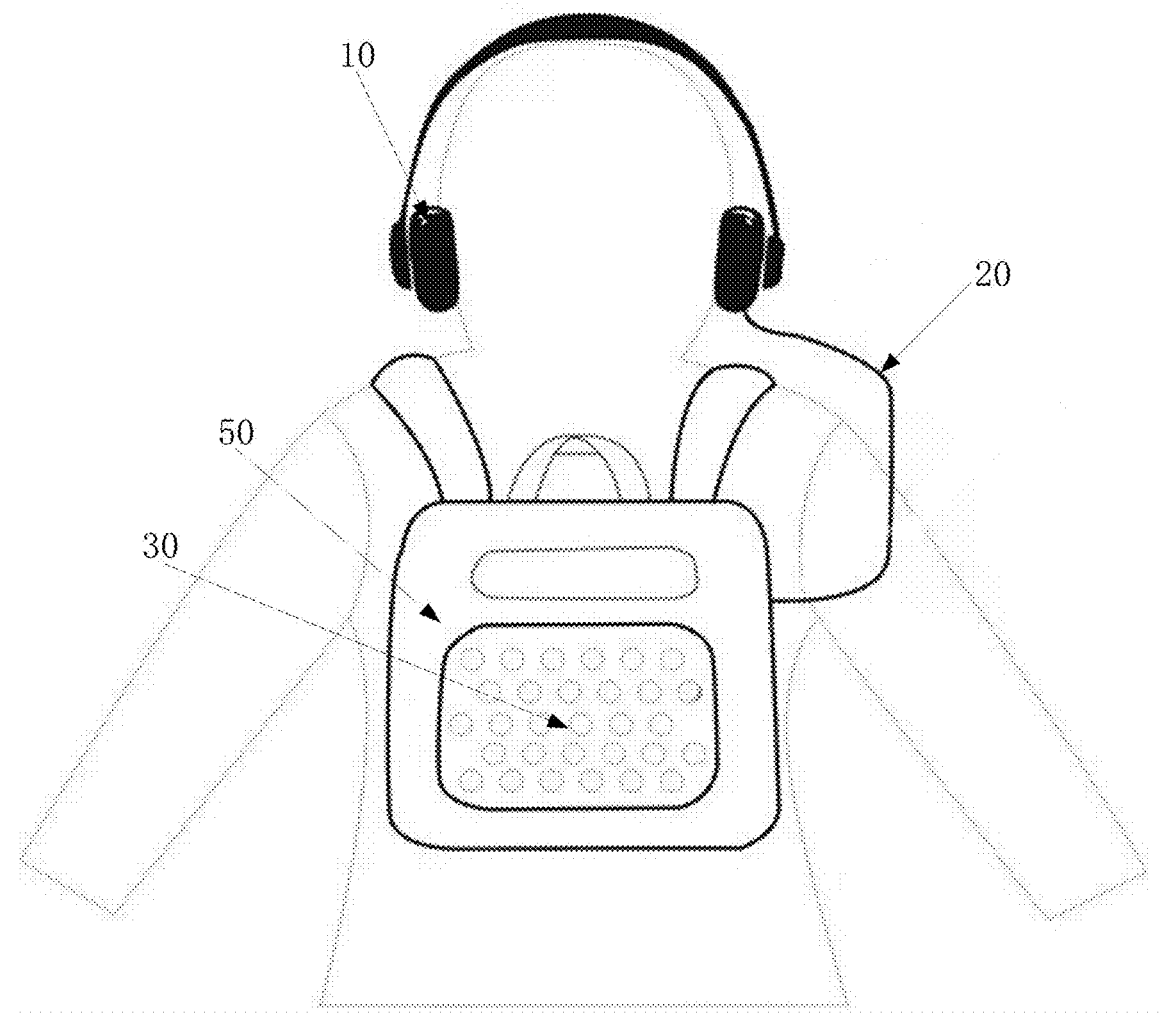
FIG. 9 shows a structure diagram of a display knapsack in accordance with some embodiments of the present disclosure.
Figure 10:
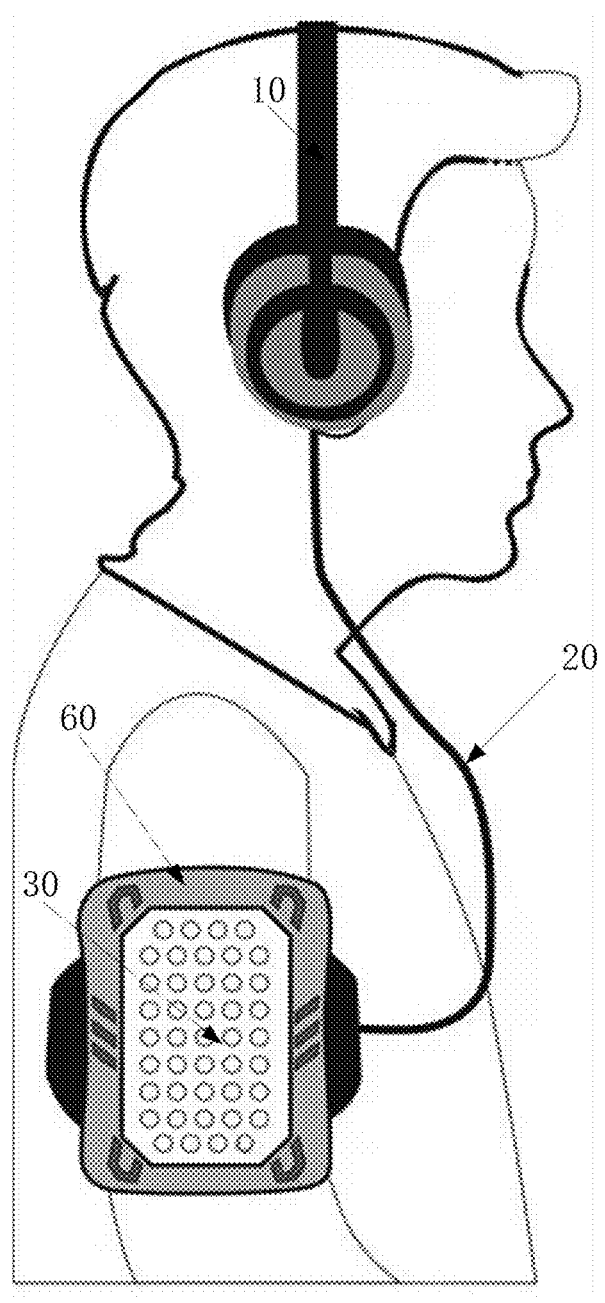
FIG. 10 shows a structure diagram of a display arm bag in accordance with some embodiments of the present disclosure.
Figure 11:
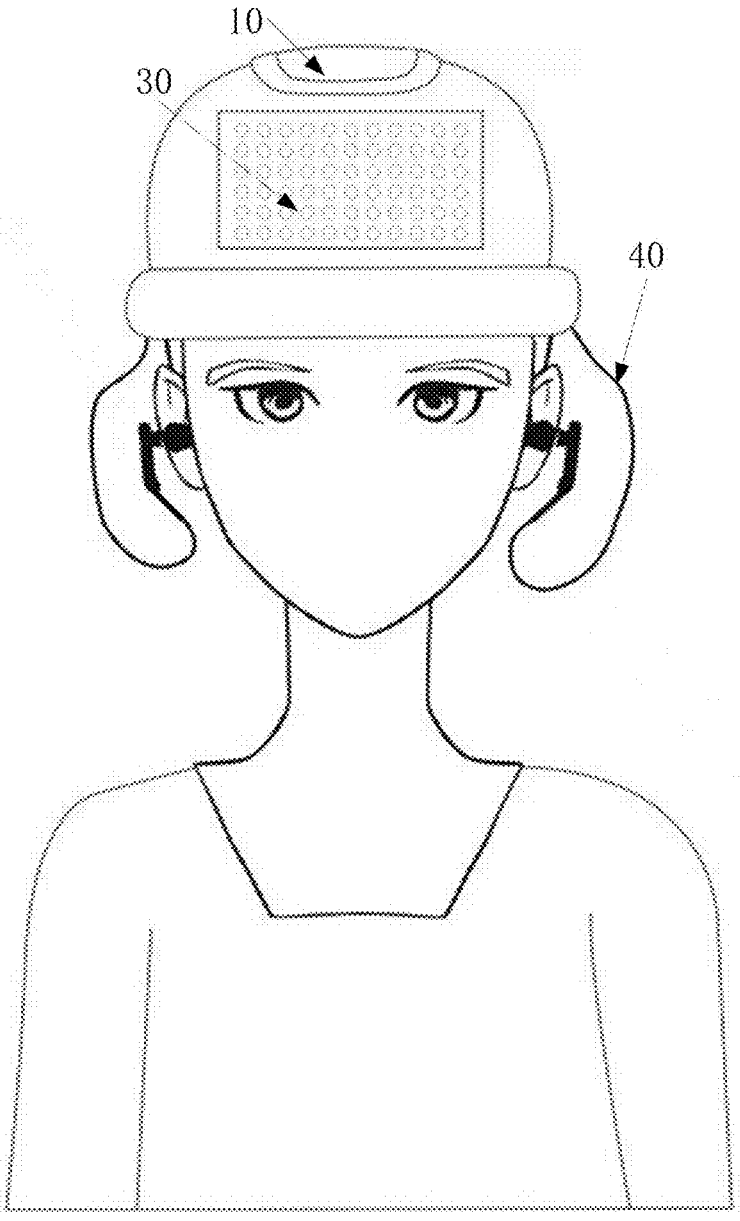
FIG. 11 shows another structure diagram of the display hood bag in accordance with some embodiments of the present disclosure.

As shown in FIG. 1 to FIG. 11, which show a display system based on controllable broadcast audio in accordance with some embodiments of the present disclosure. The display system includes a wireless transmission device, a wireless receiver, a display unit, and a data connection cable. Herein the wireless transmission device is communicated with the wireless receiver, and the wireless receiver is connected with the display unit via the data connection cable.

The display unit includes a display frame, an LED matrix disposed on the display frame, and an LED driver chip disposed in the display frame. An output end of the LED driver chip is connected with a drive end of the LED matrix.

The display unit is a mask with display function, a display panel, a display hood, a display badge, a display knapsack with a display, or a display arm bag with a display.

The mask includes a mask body and a mask display screen 30, the mask display screen 30 is disposed on an upper part of a front of the mask body, and the mask display screen 30 is connected with the wireless receiver 10 via a data cable 20. The mask is able to cover on the human face, in which the mask display 30 is required to be set above the eyes of a opening, this can be fixedly mounted on the mask body by bonding or sleeving joint. The mask display 30 can be fixed on the mask body by various ways.

The display panel includes a panel display screen 30a and a tightening belt, the panel display screen 30a is provided with connectors on both sides of a back thereon, and two ends of the tightening belt are connected with the connectors. The display hood includes a hood body and a hood display screen 30b, the hood display screen 30b is disposed on a front of the hood body, the wireless receiver 10 is disposed on a top or a back of the hood body, and the wireless receiver 10 is connected with the hood display screen 30b via a soft circuit. The display badge includes a badge display screen 30c and a lanyard, the lanyard is attached with the badge display screen 30c. The display knapsack includes a knapsack body and a knapsack display screen 30d, the knapsack display screen 30d is disposed on a face of the knapsack body. The display arm bag includes an arm bag body and an arm bag display screen 30e, the arm bag display screen 30e is provided on the arm bag body.

The wireless receiver can receive the wireless audio and display signals, convert the signals and output them to earplugs 40 and an earphone mic for audio playback through a communication connection, and then output the display signals to the display screen 30 (i.e. 30a, 30b, 30c, 30d, or 30e), which displays a set-up display to form a visual impact. Therefore, no matter whether the display screen is set on any carrier, it can be connected to the wireless receiver via the data line, so that it can form a closed display circuit.

The wireless receiver adopts a wireless headset with an output interface.

The wireless transmission device includes a wireless transmitter and an input keyboard, the input keyboard is connected with an input end of the wireless transmitter, the wireless transmitter is provided with an audio input interface for audio source.

The wireless transmitter includes an audio input module for audio source, an audio compression and amplification module, a stereo and light control modulation module, a high frequency amplification module, a microcontroller module, a high frequency locking-in module, a transmitting antenna, and a light control input interface module. Herein an output end of the audio input module for audio source is connected with an input end of the audio compression and amplification module, an output end of the audio compression and amplification module is connected with an input end of the stereo and light control modulation module, an output end of the stereo and light control modulation module is connected with and input end of the high frequency locking-in module, an output end of the high frequency locking-in module is connected with an input end of the transmitting antenna, the audio compression and amplification module is connected with the microcontroller module for two-way communication, an output end of the microcontroller module is connected with an input end of the high frequency locking-in module, an output end of the high frequency locking-in module is connected with an input end of the high frequency amplification module, and an input end of the microcontroller module is connected with an output end of the light control input interface module.

The stereo and control signal modulation module uses but is not limited to the following circuits. Specifically, the stereo and control signal modulation module includes a modulation chip IC9, and pins 9 and 10 of the modulation chip IC9 are connected the left and right channels output by the audio input module for audio source, a pin 2 is connected with a control signal output by the microcontroller, a pin 5 is connected with the power supply.

The high frequency locking-in module is suitable for universal circuits that may be realized at present, and the embodiments use but are not limited to the following circuits. Specifically, it includes a high frequency locking-in chip IC5, and a pin 1 of the high frequency locking-in chip IC5 is connected with a TP5 interface of the high frequency amplification module, a pin 2 is grounded through a capacitor C41, a pin 3 is connected with one end of the resistors R93, R71 and the capacitor C51 respectively via the resistor R70. The other end of the resistor R93 is connected with the input end of the high frequency module and a ground capacitor C32 respectively, the other end of the resistor R71 is connected with the ground capacitor C11, and the other end of the capacitor C51 is grounded. The pin 4 and pin 13 of the high frequency locking-in chip IC5 are grounded, the pin 5, pin 9, pin 10, pin 12, pin 14 and pin 16 are suspended, and the pins 6-8 are connected with different PB pins of the microcontroller module, respectively. The pin 11 of the high frequency locking-in chip IC5 is connected with the ground capacitor C53 and an oscillator of the microcontroller module through capacitor C50 respectively, and the pin 15 of the high frequency locking-in chip IC5 is connected with 5V power supply through the resistor R39 and also connected with the ground capacitor C28.

Audio signals are amplified from an audio source input part and processed by automatic level control, and then enter the audio compression module for compression processing, control signals input by a control signal keyboard are processed by the microcontroller module and then input the stereo and control signal modulation module. The stereo audio signals and the control signals which have been compressed and processed are synthesized, and then input the high frequency amplification module for frequency conversion, amplification processing, and finally through the transmitting antenna to transmit the signals out. Herein, the high frequency locking-in module is controlled by the microcontroller module to perform frequency locking and frequency switching of the high frequency oscillator signal, so as to change a carrier frequency of the transmitted signals. The power module in the embodiments provides respective power supply voltages required by each of the above functional modules.

The wireless headset includes a headset housing and a wireless reception and playback system disposed in the headset housing. The wireless reception and playback system includes a receiving antenna, a high-frequency amplification and frequency conversion unit B1, a medium-frequency adjustment unit B2, an audio extension amplification unit B3, a microcontroller unit B6, a light display unit B7, a PLL phase-locked unit B5, a local oscillator unit B4, a signal output interface unit, a speaker, and a battery voltage stabilized unit B9. An output end of the receiving antenna is connected with an input end of the high-frequency amplification and frequency conversion unit B1, an output end of the high-frequency amplification and frequency conversion unit B1 is connected with an input end of the medium-frequency adjustment unit B2, an output end of the medium-frequency adjustment unit B2 is connected with an input end of the audio extension amplification unit B3, and an output end of the audio extension amplification unit B3 is connected with an input end of the speaker. The microcontroller unit B6 is connected with the medium-frequency adjustment unit B2 for two-way communication, and an output end of the microcontroller unit B6 is connected with an output end of the light display unit B7, an input end of the signal output interface unit and an input end of the PLL phase-locked unit B5 respectively. An output end of the PLL phase-locked unit B5 is connected with an input end of the local oscillator unit B4, an output end of the local oscillator unit B4 is connected with an input end of the high-frequency amplification and frequency conversion unit B1. The battery voltage stabilized unit B9 is electrically connected with the microcontroller unit B6.

The output end of the signal output interface unit is a 3.5 audio interface.

The display unit further includes a Bluetooth chip, the Bluetooth chip is communicated with the LED driver chip, the wireless headset is connected with the Bluetooth chip through the data connection cable, and the Bluetooth chip is also connected with a microphone, a switch button, and 24 MHz crystal respectively.

The control signals are channel setting control signals, and the wireless transmitter sets the channel control signals by means of a keyboard, a computer, an IPAD, a cell phone, and other devices that can be freely and actively input, so as to realize the free control of channels that can be received by the receiver and the number of the channels to be received.

The microcontroller processes the separated channels and sets up the control signals to be transmitted to the PLL phase-locked circuit to accomplish channel locking, so that only a set number of the channels can be selected through a channel selection structure such as a channel selection knob.

The wireless receiver is originally capable of receiving 20, 50 or 60 channels, and when it receives the control signals from the wireless transmitter, it only receives the channels specified by the transmitter's programmed signal. For example, only channel 1 is received, or only channel 1, 3 and 8 are received, or only channels 2, 9, 16, 17 and 20 are received. Compared with need to select 20 or more channels to listen to, after locking the channel, a user only need to choose among the set channels, which is more convenient to operate and more humanized to use.

The wireless headset receives RF signals in the air transmitted by the wireless transmitter via the receiving antenna, mixes them with the local oscillator, changes the frequency to an IF signal, which is then demodulated by the IF demodulation circuit, and the demodulated stereo audio signals are transmitted to the audio expansion and amplification circuit, which finally drive the left and right speakers of the headset to release a sound. The wireless headset separates the display signals and outputs them to the signal output interface unit, which then transmits the signals to the LED driver chip of the display unit via the data connection cable, and the chip recognizes the signals and executes a corresponding display on the display screen.

The present disclosure also aims to provide a display method based on controllable broadcast audio, including the following steps.

S1, display images is downloaded by a user and stored in an LED display, where display content of the LED display is pre-downloaded by the user to a memory of the LED display. Currently it can download up to 16 images, the display images may be dynamic images and static images, which is stored with image numbers 0-15, with continuous updating of the technology, the display images stored in the memory of the LED display will be gradually increase, the number of its sequential extension.

S1a. a power switch of the LED display is turned on and the LED display automatically enters a receiving state. S1b, through a computer software, image data produced is downloaded to the LED display via a special antenna downloader, the LED display that has received images will show OK of received information, after all the LED displays have received the images, the images setup is all done. S1c, the images that have been downloaded to the LED display will be saved in a specified image memory of the LED display, and the images data will not be lost even after the LED display is powered off. S1d, if the data in the LED display is to be deleted or changed, this must still be done through the wireless image downloader via a PC plug-in. That is, the process of S1a and S1b will be repeated.

S2, audio and the display images are modulated into data signals by a software program in the computer, which is transmitted by a transmitter connected with the computer through an audio broadcast. Audio to be played in the computer is retrieved, and meanwhile the images to be displayed in the LED display are found, both at the same time are placed in a modulation software to be modulated into new audio signals, which are transmitted by the software in the computer via a data cable into a broadcast transmitter in the computer, and the broadcast transmitter sends out the new audio signals by broadcasting according to set frequency band signals.

The audio signals and the display images are modulated into the new audio signals, which can be sent directly to the wireless audio emitter through the audio signals and the image control signals, where the two signals are modulated into the new audio signals in the emitter, and the wireless audio emitter send out the new audio signals in accordance with set frequency band signals by broadcasting.

S3, the wireless receiver audio broadcasts signals, which will be demodulated into audio signals and image display signals. After the wireless receiver receives the set frequency band signals modulation, the new audio signals will be demodulated to restore the original audio signals and the image display signals.

S4, the wireless receiver plays the audio signals through the speaker, and the image display signals are transmitted to the LED display through the data cable. After restoring the signals the processor in the wireless receiver transmits the audio signals to the speaker for audio playback, and the image display signals are connected to the LED display on the receiver or headset via the data cable.

S5, the LED display calls corresponding stored images for display according to received image display signals information. The LED display receives the image display signals and reads the display information, and then jumps to the corresponding stored image information for display according to the read signals.

The antenna audio receiver (e.g. special wireless receiver or headset) is connected with the LED display via a special cable, as shown in FIG. 1.

Once the LED display is connected with the headset or receiver via the data cable, the LED display automatically enters the state of receiving commands via the data cable. If at this time the headset is turned off or although it is turned on but does not receive commands from the transmitter, the LED display will display the image of No. 0. Otherwise, the LED display will display the images numbered from 1-15 transmitted by the transmitter, and the transmitter is configured as shown in FIG. 1.

The foregoing description is only some preferred embodiments of the present disclosure, but is not intended to limit the present invention. Any modification, equivalent replacements and improvements made within the concept and principles of the present disclosure shall be included in the scope of protection of the present invention.

What is claimed is:

1. A display system based on controllable broadcast audio, comprising a wireless transmission device, a wireless receiver, a display unit, and a data connection cable;

wherein the wireless transmission device is in communication with the wireless receiver, the wireless receiver and the display unit are independent electronic units from each other, and the wireless receiver is connected with the display unit via the data connection cable;

wherein the wireless transmission device comprises a wireless transmitter and an input keyboard, the input keyboard is connected with an input end of the wireless transmitter, the wireless transmitter is provided with an audio input interface for audio source;

wherein the wireless receiver adopts a wireless headset with an output interface;

wherein the display unit is one of a mask with display function, a display panel, a display hood, a display badge, a display knapsack with a display, or a display arm bag with a display; the display unit has stored pre-downloaded display images, and the display images are dynamic images or static images;

wherein the wireless transmission device is configured to simultaneously transmit audio signals, control signals, and display signals by means of broadcasting;

wherein the wireless receiver is configured to receive the audio signals and the display signals transmitted by the wireless transmission device, and through a communication connection, convert and output the audio signals to earplugs and an earphone mic of the wireless headset for audio playback, and also output the display signals to the display unit for display through the data connection cable; and wherein the control signals are channel setting control signals, and the wireless transmission device is configured to set the channel control signals by means of the input keyboard, a computer, an IPAD, a cell phone, or other devices that is freely and actively input, and then through broadcasting to realize a free control of channels that is received by the wireless receiver and the number of the channels to be received.

2. The display system based on controllable broadcast audio according to claim 1, wherein the display unit comprises a display frame, an LED matrix disposed on the display frame, and an LED driver chip disposed in the display frame; wherein an output end of the LED driver chip is connected with a drive end of the LED matrix.

3. The display system based on controllable broadcast audio according to claim 1, wherein the mask comprises a mask body and a mask display screen, the mask display screen is disposed on an upper part of a front of the mask body, and the mask display screen is connected with the wireless receiver via a data cable;

wherein the display panel comprises a panel display screen and a tightening belt, the panel display screen is provided with connectors on both sides of a back thereon, and two ends of the tightening belt are connected with the connectors;

wherein the display hood comprises a hood body and a hood display screen, the hood display screen is disposed on a front of the hood body, the wireless receiver is disposed on a top or a back of the hood body, and the wireless receiver is connected with the hood display screen via a soft circuit;

wherein the display badge comprises a badge display screen and a lanyard, the lanyard is attached with the badge display screen;

wherein the display knapsack comprises a knapsack body and a knapsack display screen, the knapsack display screen is disposed on a face of the knapsack body; and wherein the display arm bag comprises an arm bag body and an arm bag display screen, the arm bag display screen is provided on the arm bag body.

4. The display system based on controllable broadcast audio according to claim 1, wherein the wireless transmitter comprises an audio input module for audio source, an audio compression and amplification module, a stereo and light control modulation module, a high frequency amplification module, a microcontroller module, a high frequency locking-in module, a transmitting antenna, and a light control input interface module;

wherein an output end of the audio input module for audio source is connected with an input end of the audio compression and amplification module;

wherein an output end of the audio compression and amplification module is connected with an input end of the stereo and light control modulation module, and wherein an output end of the stereo and light control modulation module is connected with and input end of the high frequency locking-in module;

wherein an output end of the high frequency locking-in module is connected with an input end of the transmitting antenna;

wherein the audio compression and amplification module is connected with the microcontroller module for two-way communication;

wherein an output end of the microcontroller module is connected with an input end of the high frequency locking-in module;

wherein an output end of the high frequency locking-in module is connected with an input end of the high frequency amplification module; and wherein an input end of the microcontroller module is connected with an output end of the light control input interface module.

5. The display system based on controllable broadcast audio according to claim 4, wherein the wireless headset comprises a headset housing and a wireless reception and playback system disposed in the headset housing;

wherein the wireless reception and playback system comprises a receiving antenna, a high-frequency amplification and frequency conversion unit, a medium-frequency adjustment unit, an audio extension amplification unit, a microcontroller unit, a light display unit, a PLL phase-locked unit, a local oscillator unit, a signal output interface unit, a speaker, and a battery voltage stabilized unit;

wherein an output end of the receiving antenna is connected with an input end of the high-frequency amplification and frequency conversion unit, an output end of the high-frequency amplification and frequency conversion unit is connected with an input end of the medium-frequency adjustment unit, an output end of the medium-frequency adjustment unit is connected with an input end of the audio extension amplification unit, and an output end of the audio extension amplification unit is connected with an input end of the speaker;

wherein the microcontroller unit is connected with the medium-frequency adjustment unit for two-way communication, and an output end of the microcontroller unit is connected with an output end of the light display unit, an input end of the signal output interface unit and an input end of the PLL phase-locked unit respectively;

wherein an output end of the PLL phase-locked unit is connected with an input end of the local oscillator unit, an output end of the local oscillator unit is connected with an input end of the high-frequency amplification and frequency conversion unit; and wherein the battery voltage stabilized unit is electrically connected with the microcontroller unit.

6. The display system based on controllable broadcast audio according to claim 5, wherein the output end of the signal output interface unit is a 3.5 audio interface.

7. The display system based on controllable broadcast audio according to claim 6, wherein the display unit further comprises a Bluetooth chip, the Bluetooth chip is communicated with the LED driver chip, the wireless headset is connected with the Bluetooth chip through the data connection cable, and the Bluetooth chip is also connected with a microphone, a switch button, and 24 MHz crystal respectively.

* * * * *